(12) United States Patent
Kwon

(10) Patent No.: US 7,394,781 B2
(45) Date of Patent: Jul. 1, 2008

(54) WIRELESS REMOTE CONTROLLER USING TIME DIVISION PROTOCOL AND SATELLITE RADIO RECEIVER INCLUDING THE SAME

(75) Inventor: Hyuk-Joon Kwon, KyungKi-Do (KR)

(73) Assignee: Kiryung Electronics Co., Ltd., Seoul (KR)

( * ) Notice: Subject to any disclaimer, the term of this patent is extended or adjusted under 35 U.S.C. 154(b) by 488 days.

(21) Appl. No.: 10/979,832

(22) Filed: Nov. 3, 2004

(65) Prior Publication Data

US 2005/0094591 A1   May 5, 2005

(30) Foreign Application Priority Data

Nov. 5, 2003   (KR) ...................... 10-2003-0078058

(51) Int. Cl.
*H04B 7/212* (2006.01)
*H04B 1/06* (2006.01)
*H04B 7/185* (2006.01)
*H04B 1/034* (2006.01)
*H04H 20/00* (2008.01)

(52) U.S. Cl. .................. 370/321; 370/337; 370/347; 370/442; 455/345; 455/3.02; 455/12.1; 455/99

(58) Field of Classification Search .................. 455/345, 455/3.02, 99, 12.1; 370/321, 337, 347, 442
See application file for complete search history.

(56) References Cited

U.S. PATENT DOCUMENTS

| | | | |
|---|---|---|---|
| 4,069,454 A | 1/1978 | Winkelmann | |
| 5,227,804 A | 7/1993 | Oda | |
| 5,257,033 A | 10/1993 | Roche | |
| 5,319,716 A | 6/1994 | McGreevy | |
| 5,568,516 A | 10/1996 | Strohallen et al. | |
| 5,628,056 A | 5/1997 | Grysiewicz et al. | |
| 5,867,794 A | 2/1999 | Hayes et al. | |
| 5,970,390 A | 10/1999 | Koga et al. | |
| 6,339,696 B1 | 1/2002 | Chan et al. | |
| 6,493,546 B2 * | 12/2002 | Patsiokas | 455/277.1 |
| 6,535,719 B1 | 3/2003 | Suzuki et al. | |
| 2003/0236075 A1 * | 12/2003 | Johnson et al. | 455/99 |

* cited by examiner

*Primary Examiner*—Barry Taylor
(74) *Attorney, Agent, or Firm*—Dykema Gossett PLLC

(57) ABSTRACT

Disclosed is a wireless remote controller using a time division protocol. A satellite radio equipped with the wireless remote controller is also disclosed which performs an audio processing operation for time division multiplexing (TDM) and orthogonal frequency division multiplexing (OFDM) signals respectively transmitted from satellites and a terrestrial repeater by demodulating and digitally processing the TDM and OFDM signals. The remote controller includes a transceiver for performing a bi-directional communication through a single channel in such a manner that transmission and reception sides are sync with each other in accordance with a time division duplexing scheme, the transceiver wirelessly transmitting a command from a user, and executing a response received thereto. A Bluetooth radio modem and a commercially available inexpensive protocol can be used, so that it is possible to inexpensively provide, to the driver, the same convenience and advantages as the conventional system. Also, the time division duplexing (TDD) wireless remote controller consumes reduced power. The wireless remote controller also allows the driver to manipulate the satellite radio for listening to music of high quality and displaying diverse information while minimizing reduction of his attention to driving the motor vehicle to maintain safe driving of the motor vehicle.

5 Claims, 7 Drawing Sheets

WIRELESS REMOTE CONTROLLER USING TIME DIVISION PROTOCOL AND SATELLITE RADIO RECEIVER INCLUDING THE SAME

BACKGROUND OF THE INVENTION

1. Field of the Invention

The present invention relates to a wireless remote controller for a satellite radio receiver, and more particularly to a wireless remote controller which uses a time division duplexing system using a time division protocol, thereby being capable of overcoming a limitation on the directionality of remote control for a satellite radio while efficiently utilizing limited frequency resources to implement diverse additional information services. The present invention also relates to a satellite radio equipped with such a wireless remote controller.

2. Description of the Related Art

Most conventional AM/FM radios have a sound quality and reception sensitivity insufficient to meet the user's desire. In particular, in radios installed in motor vehicles, there are many difficulties in securing a desired reception sensitivity due to the mobility feature of those motor vehicles. In order to solve such a problem, satellite radios have been developed. Satellite radios can provide diverse digital services of high quality while maintaining a highly-sensitive reception state. However, such satellite radios have drawbacks when they are used in a running motor vehicle to provide music and other services of high quality. This is because the satellite radios have a complex configuration to provide many channels and diverse additional services, so that they cannot be conveniently manipulated by the user. For this reason, when a driver manipulates such a satellite radio installed in a motor vehicle while driving the motor vehicle, his attention to driving the motor vehicle may be reduced, so that an accident may occur. In order to allow the driver to conveniently manipulate the satellite radio without losing his attention to driving the motor vehicle, a remote controller for remotely controlling the satellite radio has been developed. This remote controller uses an infrared system mainly used in existing electronic products. However, the remote controller of such a type has a problem in that it must be used under the condition in which the driver pays attention to the directionality of the remote controller. Since the receiver unit of the satellite radio also has a limitation on its position due to the limited directionality of the remote controller, there may also be a problem in that where the satellite radio is installed at the central portion of the front panel in the passenger compartment of the motor vehicle, or at a position where the receiver unit cannot reliably receive a remote control signal from the remote controller, it is necessary to separate the receiver unit from the satellite radio, in order to install the receiver unit at a position where it can reliably receive the remote control signal from the remote controller. Furthermore, where the remote controller is configured to transmit digital data in an RF manner, its circuitry is complex. It is also necessary to secure error processibility and stability. For this reason, there is a problem of high costs. Meanwhile, wireless remote controller used in general satellite radios includes a combination of simple function keys. In other words, these wireless remote controllers have no hardware configuration capable of displaying information of diverse additional services, for example, a channel number, channel name, channel category, artist name, song title, subsidiary text, and diagnostic message.

Now, an example of conventional satellite radios will be described.

FIG. 1 is a schematic view illustrating a broadcasting system for a satellite radio broadcasting service, for example, a satellite radio broadcasting service provided by Sirius Satellite Radio Inc. Referring to FIG. 1, the satellite radio broadcasting system includes a radio studio 1, a studio-side repeater 3, a first remote uplink repeater 5, a second uplink repeater 7, a first radio satellite 9, a second radio satellite 11, a bi-directional communication satellite 11 such as a very small aperture terminal (VSAT) satellite, terrestrial repeaters 15, and base stations 17. VSATs are typically installed, for audio, facsimile, and data transmission, at out-of-the-way places, in the country, or farming and fishing villages where no terrestrial network is constructed.

The radio studio 1 produces a program to be broadcast, and transmits broadcast data of the produced program to the VSAT communication satellite 13 via the radio-side repeater 3 directly connected to the radio studio 1. Simultaneously, the radio studio 1 transmits the broadcast data to the first and second remote uplink repeaters 5 and 7 which, in turn, transmit the broadcast data to the first and second radio satellites 9 and 11, respectively. In response to the broadcast data, the first and second radio satellites 9 and 11 transmit satellite signals TDM1 and TDM2 to a mobile receiver, respectively. Meanwhile, the VSAT communication satellite 13 transmits an orthogonal frequency division multiplexing (OFDM) signal to the terrestrial repeaters 15, so as to cope with a reception difficulty caused by topographical or structural problems. The OFDM signal is transmitted to the mobile receivers via respective base stations 17 or respective terrestrial repeaters 15. OFDM uses a multi-carrier transmission system using several carrier signals, so as to divide a radio channel of a wide band into radio channels of a narrow band, thereby achieving transmission of a large amount of information and high-speed transmission. Thus, most areas receive two satellite signals TDM1 and TDM2, whereas the OFDM signal is used as a terrestrial wave for areas involving topographical or structural problems.

FIG. 2 is a block diagram illustrating the control circuit of a satellite radio system manufactured by Sirius Satellite Radio Inc. As shown in FIG. 2, the satellite radio system includes a tuner 20, a signal demodulating unit 30, a digital signal processing unit 40. The tuner 20 includes an RF processor 21 having a well-known configuration for dividing an input satellite signal into time division multiplexing (TDM) and OFDM components, and outputting the resultant signals. The signal demodulating unit 30 includes an analog/digital (A/D) converter 31 for performing a function of converting an analog signal into a digital signal, a demodulator 32 for demodulating digital data outputted from the A/D converter 31, a TDM selector 33 for selecting a signal having a highest signal-to-noise ratio (SNR) from TDM signals outputted from the demodulator 32, and an OFDM selector 34 for selecting a signal having a highest SNR from OFDM signals outputted from the demodulator 32. The signal demodulating unit 30 also includes a first memory 35 for providing comparative SNR data to the TDM selector 33 and OFDM selector 34, a signal mixer 36 for mixing signals outputted from the TDM selector 33 and OFDM selector 34, and a second memory 37 connected to the signal mixer 36. On the other hand, the digital signal processing unit 40 includes an oscillator 41 for outputting an oscillating signal of 16.384 MHz, a digital/analog (D/A) processor 42 for processing data received from an external controller 50 and a signal outputted from the signal mixer 36, thereby outputting analog signals, respectively, and third and fourth memories 43 and 44 connected to the D/A processor 42. An audio D/A converter 60 is coupled to the D/A processor 42, in order to output an audio signal and a stereo audio signal.

When a satellite signal having a bandwidth of 12.5 MHz while being centered on 2.32625 GHz is inputted to the satellite radio system manufactured by Sirius Satellite Radio Inc to have the above described configuration, the tuner 20 divides the inputted satellite signal into signals of different frequency bands, that is, TDM signals TDM1 and TDM2 and an OFDM signal. The TDM signals TDM1 and TDM2, and OFDM signal outputted from the tuner 20 are sent to the signal demodulating unit 30. In the signal demodulating unit 30, the signals are converted from an analog form into a digital form, and then subjected to a digital down-converting process. Subsequently, the resultant signals are demodulated, and then sent to the signal mixer 36. The signal mixer 36 selects a signal having a highest SNR from the TDM signals TDM1 and TDM2 and OFDM signal, and performs a forward error collection (FEC) process for the selected signal. The digital signal processing unit 40 digitally processes the resultant data obtained in accordance with the FEC process, and outputs the resultant digital audio signal in the form of an IbS (Philips Inter-IC Sound Interface) format. The audio signal has a basic sampling rate of 32 KHz, and a maximum sampling rate of 96 KHz. The interface of the digital signal processing unit 40 to the external controller 50 uses a synchronous serial interface (SSI) format. Generally, the external controller 50 may be implemented in the form of a wired or wireless remote controller (hereinafter, simply referred to as a "wireless remote controller"). Alternatively, the external controller 50 may be integral with the body of the satellite radio system.

However, the above mentioned conventional satellite radio requires a complex manipulation, as compared to traditional radios, because it has a configuration capable of providing music services of high quality and diverse additional services, even where it is installed in a motor vehicle. As mentioned above, when the driver manipulates an operating panel integral with the body of the radio or a wired remote controller during the driving of the motor vehicle, his attention to driving the motor vehicle may be reduced, so that an accident may occur. To this end, it is necessary to design a wireless remote controller capable of preventing the driver from losing his attention to driving the motor vehicle during the manipulation of the remote controller, in order to allow stable use of the satellite radio.

Infrared wireless remote controllers mainly used in existing electronic appliances should be used under the condition in which the user pays attention to the directionality of the remote controller. Also, the receiver unit adapted to receive a remote control signal from such an infrared wireless remote controller has a limitation on its position due to the limited directionality of the remote controller. For this reason, there may also be a problem in that where a satellite radio adapted to use such an infrared wireless remote controller is installed at the central portion of the front panel in the passenger compartment of a motor vehicle, or at a position where the receiver unit cannot reliably receive a remote control signal from the remote controller, it is necessary to separate the receiver unit from the satellite radio, in order to install the receiver unit at a position where it can reliably receive the remote control signal from the remote controller. Of course, the receiver unit is connected to the satellite radio by a cable. Furthermore, the infrared wireless remote controller implements a unidirectional communication, so that it can only transmit an operating command from the user, without having a signal reception function. Although bi-directional transmission of digital data can be achieved using two bands in a general RF system, there are various problems in this case. For example, the circuitry of the system is complex. It is also necessary to secure error processibility and stability. For this reason, there is a problem of high costs. A Bluetooth scheme is known as a standard wireless communication method. However, it is undesirable to apply the Bluetooth scheme to a wireless remote controller for use in satellite radios because Bluetooth modules are expensive. Also, the above mentioned infrared wireless remote controller has a drawback in that it cannot display information of diverse additional services, provided by the wireless satellite radio, to be identified by the user, for example, a channel number, channel name, channel category, artist name, song title, subsidiary text, and diagnostic message, because it uses a unidirectional communication system.

SUMMARY OF THE INVENTION

The present invention has been made in view of the above mentioned problems involved with the related art, and an object of the invention is to provide an inexpensive wireless remote controller using a time division protocol, which can implement a bi-directional communication by use of a short-bandwidth time division duplex communication method, while being capable of having a free directionality.

Another object of the invention is to provide a satellite radio equipped with the wireless remote controller.

In accordance with one aspect, the present invention provides a wireless remote controller using a time division protocol to remotely control a satellite radio adapted to perform an audio processing operation for time division multiplexing (TDM) and orthogonal frequency division multiplexing (OFDM) signals respectively transmitted from satellites and a terrestrial repeater by demodulating and digitally processing the TDM and OFDM signals, the remote controller comprising: a transceiver for performing a bi-directional communication through a single channel in such a manner that transmission and reception sides are sync with each other in accordance with a time division duplexing scheme, the transceiver wirelessly transmitting a command from a user, and executing a response received thereto. Preferably, the transceiver comprises: a microprocessor including a control logic for generating a control signal, a transmission buffer for temporarily storing output data, a reception buffer for temporarily storing input data while storing data produced during processing operations, thereby supporting a protocol processing operation, a serial programming interface (SPI) logic linked to an SPI, and a protocol engine for controlling input and output signals thereof associated with the control logic, in cooperation with the control logic, and analyzing input data, thereby determining a subsequent processing operation; and a Bluetooth radio modem including a system control logic for controlling transmission and reception of signals in accordance with the cooperation of the control logic and protocol engine, a clock generation/distribution unit for sending a clock, received thereto, to the control logic, or generating another clock, and distributing the generated clock, a register file storage unit for storing data set through the SPI, and the SPI for performing a bi-directional serial communication with the register file storage unit to perform a set state checking operation. Preferably, the wireless remote controller further comprises an image processing unit connected to the transceiver, and adapted to perform a text and image processing operation corresponding to the command from the user.

In accordance with another aspect, the present invention provides a satellite radio equipped with a wireless remote controller using a time division protocol, the satellite radio comprising: a display control unit for supporting operations of a user while performing a display operation corresponding to a command from the user; a display control unit-side transceiver for performing a bi-directional communication through a single channel in such a manner that transmission and reception sides are sync with each other in accordance with a time division duplexing scheme, the transceiver wirelessly transmitting a command from the display control unit, and executing a response received from a downlink processor; a downlink processor-side transceiver for performing a bi-directional communication through a single channel in such a manner that transmission and reception sides are sync with each other in accordance with a time division duplexing scheme, the transceiver transmitting the command received from the display control unit-side transceiver, and transmitting a response of the downlink processor to the command from the display control unit; and the downlink processor for executing the command transmitted from the display control unit, and generating a response corresponding to the command execution, the downlink processor performing an audio processing operation for TDM and OFDM signals respectively transmitted from satellites and a terrestrial repeater by demodulating and digitally processing the TDM and OFDM signals.

In accordance with another aspect, the present invention provides a satellite radio equipped with a wireless remote controller using a time division protocol, the satellite radio comprising: a display control unit including a key input unit for supporting operations of a user, a display unit for performing a display operation corresponding to an operation of the key input unit, and a micro controller for controlling for processing a key input signal from the key input unit, a display signal, and input and output audio signals, the micro controller including a general purpose I/O (GPIO) for outputting a GPIO signal adapted to select a signal outputted from a display control unit-side transceiver; a display control unit-side transceiver for performing a bi-directional communication through a single channel in such a manner that transmission and reception sides are sync with each other in accordance with a time division duplexing scheme, the transceiver wirelessly transmitting a command from the display control unit, and executing a response received from a downlink processor; a downlink processor-side transceiver for performing a bi-directional communication through a single channel in such a manner that transmission and reception sides are sync with each other in accordance with a time division duplexing scheme, the transceiver transmitting the command received from the display control unit-side transceiver, and transmitting a response of the downlink processor to the command from the display control unit; and the downlink processor including a receiver for TDM and OFDM signals, an analog/digital (A/D) converter for converting an analog signal received from the receiver into a digital signal, a demodulator for demodulating the digital signal received from the A/D converter, a TDM selector for selecting a signal having a highest SNR from TDM signals outputted from the demodulator, an OFDM selector for selecting a signal having a highest SNR from OFDM signals outputted from the demodulator, a memory for providing comparative SNR data to the TDM and OFDM selectors, a signal mixer for mixing signals outputted from the TDM and OFDM selectors, a digital/analog (D/A) processor for processing a signal outputted from the signal mixer, thereby outputting an analog signal, and an audio D/A converter for outputting an audio signal and a stereo audio signal to the D/A processor.

Preferably, each of the display control unit-side transceiver and downlink processor-side transceiver comprises: a microprocessor including a control logic for generating a control signal, a transmission buffer for temporarily storing output data, a reception buffer for temporarily storing input data while storing data produced during processing operations, thereby supporting a protocol processing operation, an SPI logic linked to an SPI, and a protocol engine for controlling input and output signals thereof associated with the control logic, in cooperation with the control logic, and analyzing input data, thereby determining a subsequent processing operation; and a Bluetooth radio modem including a system control logic for controlling transmission and reception of signals in accordance with the cooperation of the control logic and protocol engine, a clock generation/distribution unit for sending a clock, received thereto, to the control logic, or generating another clock, and distributing the generated clock, a register file storage unit for storing data set through the SPI, and the SPI for performing a bi-directional serial communication with the register file storage unit to perform a set state checking operation. The microprocessor may be an 8MIPS RISC microprocessor or an 8MIPS microprocessor.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENTS

Now, preferred embodiments of the present invention will be described with reference to the annexed drawings.

A time division multiple access (TDMA) scheme is used in digital cellular phone communications, along with a code division multiple access (CDMA) scheme. In accordance with the TDMA scheme, a plurality of base stations perform multiple access through a single repeater so that they communicate at the same frequency in a time division manner while preventing their communication signals from overlapping with one another. In addition to such a TDMA scheme, there are a frequency division multiple access (FDMA) scheme and a CDMA scheme as multiple access schemes for satellite communications. The TDMA scheme is mainly classified into a synchronous TDMA scheme and an asynchronous TDMA scheme. In accordance with the synchronous TDMA scheme, the basic transmission/reception interval of signals, that is, a time frame, has a fixed length. Accordingly, it is possible to ensure all accessing base stations to transmit data at times assigned thereto, respectively. On the other hand, each base station has an optional access right in accordance with the asynchronous TDMA scheme. Accordingly, the asynchronous TDMA scheme adopts a specific method for controlling access rights of base stations. In such TDMA schemes, although a temporary carrier amplification occurs when a plurality of base stations perform multiple access through a single repeater, it is possible to operate the repeater in a saturated state even when the number of accessing base stations increases because only one carrier is used. Meanwhile, time division duplex (TDD)-based protocols use a bi-directional channel with a single carrier frequency. Accordingly, it is possible to reduce the hardware complexity of mobile terminals.

Figure 1:
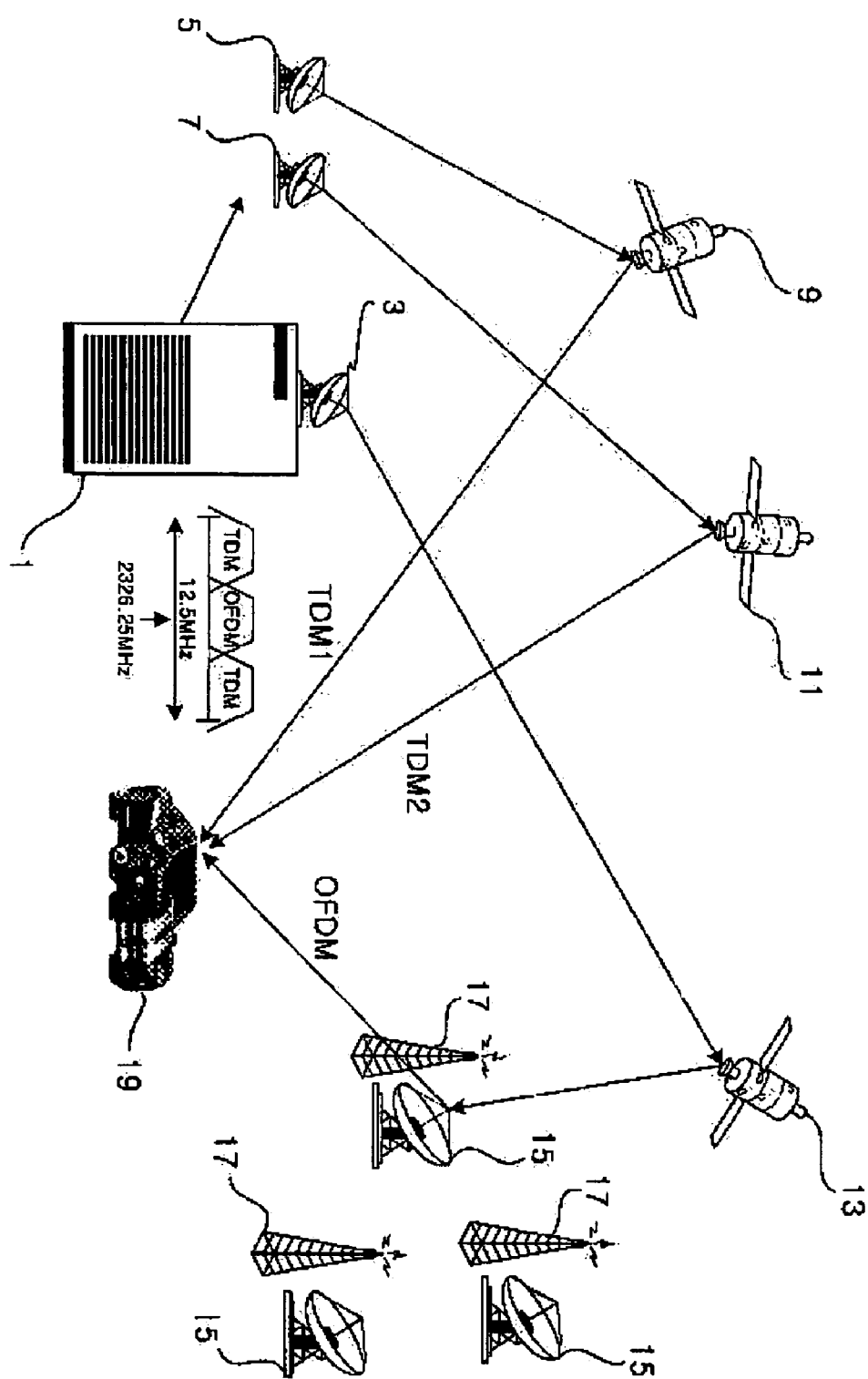
FIG. 1 is a schematic view illustrating a broadcasting system for a satellite radio broadcasting service provided by Sirius Satellite Radio Inc.
Figure 2:
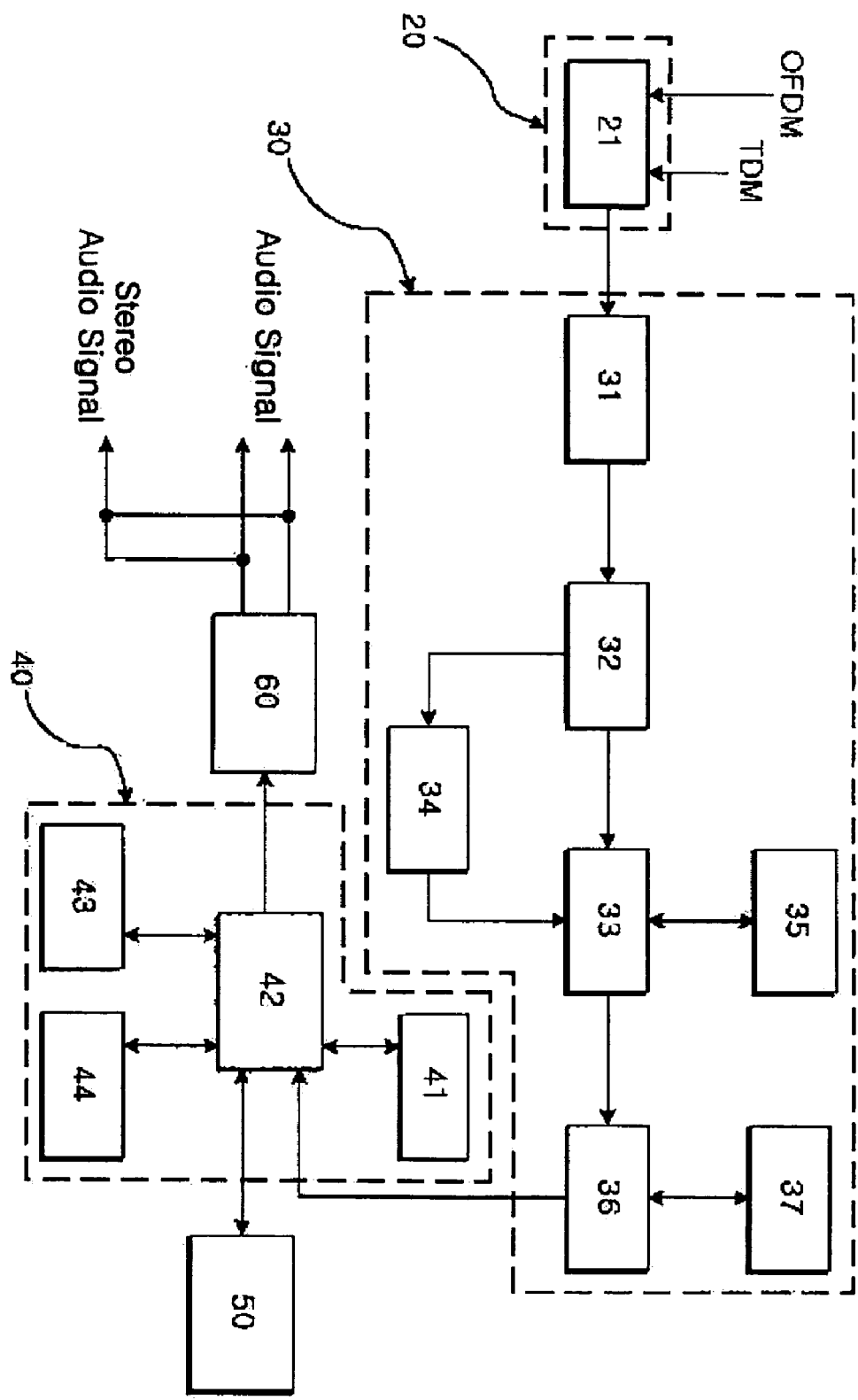
FIG. 2 is a block diagram illustrating the control circuit of the satellite radio system manufactured by Sirius Satellite Radio Inc.
Figure 3:
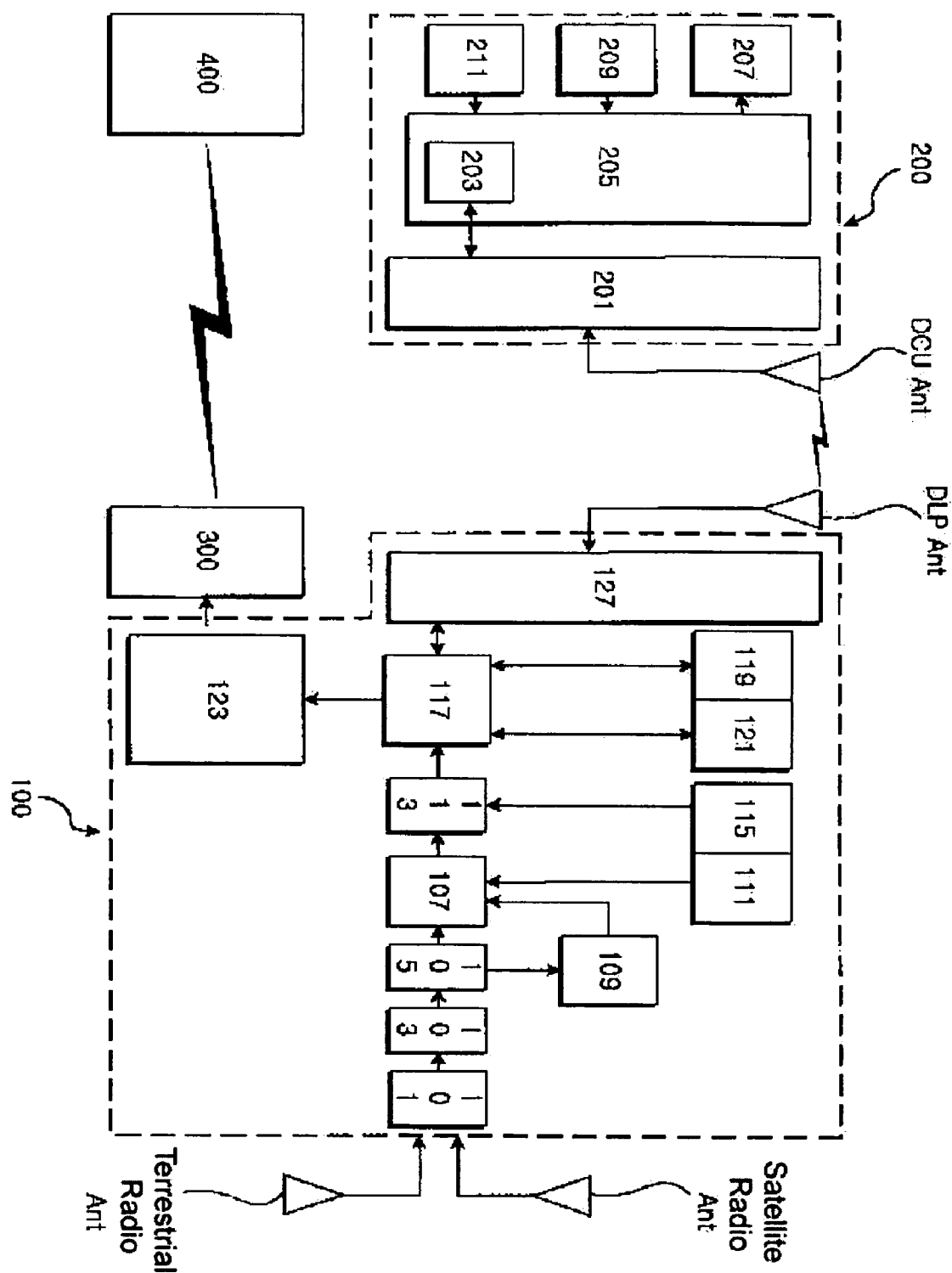
FIG. 3 is a block diagram illustrating a satellite radio system using a wireless remote controller according to the present invention.

FIG. 3 is a block diagram illustrating a satellite radio system using a wireless remote controller according to the present invention. Referring to FIG. 3, the configuration of a system, to which the present invention is applied, is shown. As shown in FIG. 3, the system mainly includes a downlink processor 100, and a display control unit 200. The downlink processor (DLP) 100 has a configuration used in existing satellite radio systems. In addition to such a satellite radio system configuration, the DLP 100 also includes a TDD transceiver. Similarly, the display control unit (DCU) 200 includes a TDD transceiver, in addition to a wired remote controller having a configuration used in existing wired remote controllers. The TDD transceivers use a frequency of 2.4 GHz for their communication.

Specifically, the DLP 100 includes a receiver 101 for amplifying, to a desired level, a weak radio frequency (RF) signal filtered after being received from a satellite radio antenna or terrestrial radio antenna, mixing the amplified RF signal with a local oscillating frequency, detecting an intermediate frequency signal from the resultant mixed frequency signal, and demodulating the detected intermediate frequency signal, thereby recovering an original signal, an A/D converter 103 for performing a function of converting an analog signal received from the receiver 101 into a digital signal, a demodulator 105 for demodulating the digital signal received from the A/D converter 103, a TDM selector 107 for selecting a signal having a highest SNR from TDM signals outputted from the demodulator 105, and an OFDM selector 109 for selecting a signal having a highest SNR from OFDM signals outputted from the demodulator 105. The DCU 100 also includes a first memory 111 for providing comparative SNR data to the TDM selector 107 and OFDM selector 109, a signal mixer 113 for mixing signals outputted from the TDM selector 107 and OFDM selector 109, and a second memory 115 connected to the signal mixer 113. The DCU 100 further includes a D/A processor 117 for processing a signal outputted from the signal mixer 113, thereby outputting an analog signal, third and fourth memories 119 and 121 connected to the D/A processor 117, and an audio D/A converter 123 connected to the D/A processor 117, and adapted to output an audio signal and a stereo audio signal. An FM modulator 300 is connected to the audio D/A converter 123. In accordance with the present invention, a DLP-side transceiver 127 is mounted to the D/A processor 117. A DLP-side antennal DLP Ant is also connected to the DLP-side transceiver 127.

On the other hand, the DCU 200 includes a DCU-side antenna DCU Ant for receiving data transmitted via the DLP-side antenna DLP Ant, a DCU-side transceiver 201 for receiving data from the DCU-side antenna DCU Ant, and processing the received data, a general purpose I/O (GPIO) 203 for outputting a GPIO signal adapted to select a signal outputted from the DCU-side transceiver 201, and a micro controller 205 for controlling the whole operation of the DCU 200. The GPIO 203 is included in the micro controller 205. The DCU 200 also includes a display unit 207, a key input unit 209, and a memory 211. The display unit 207 and key input unit 209 are connected to the micro controller 205 so as to provide a user interface. The memory 211 serves to temporarily store input and output signals. In particular, the micro controller 205 checks the state of a radio modem in accordance with a given protocol, and controls the radio modem in accordance with the checked state, in order to perform modulation and demodulation of control commands from the user and additional information at a frequency of 2.4 GHz, for communication of the DCU 200 with the DLP 100.

Of course, the satellite radio system is equipped with a car audio FM receiver 400 having a well-known configuration.

Figure 4:
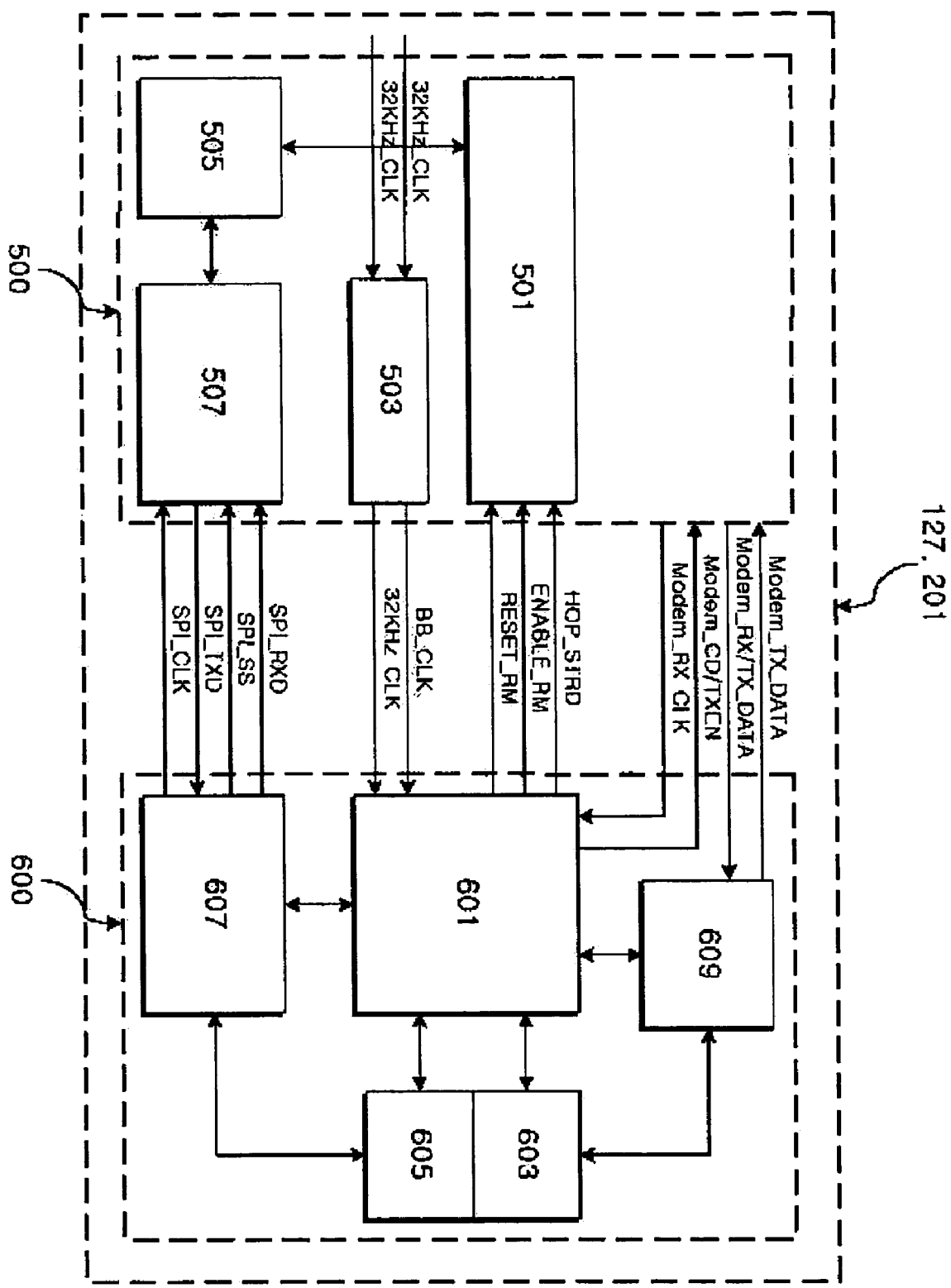
FIG. 4 is a block diagram illustrating the control circuit of a transceiver according to the present invention.

FIG. 4 is a block diagram illustrating the control circuit of a TDD transceiver. Referring to FIG. 4, each of the transceivers 127 and 201 used in accordance with the present invention includes a Bluetooth radio modem 500, and a microprocessor 600. The radio modem 500 includes a system control logic 501, a clock generation/distribution unit 503, a register file storage unit 505, and a serial programming interface (SPI) 507. The microprocessor 600 includes a control logic 601, a transmission buffer 603, a reception buffer/message assembly buffer (hereinafter, simply referred to as a "reception buffer") 605, an SPI interface logic 607, and a protocol logic or protocol engine 609.

A bi-directional digital communication is achieved between the DLP 100 and the DCU 200 by the Bluetooth radio modem 500. In wireless remote controllers for satellite radios, it is unnecessary to use a high performance Bluetooth technique providing a high transmission rate of 1 Mbps. That is, it is possible to use a commercially available inexpensive protocol, in place of a high performance or expensive Bluetooth protocol. Accordingly, for the microprocessor 600, a microprocessor having a low performance may be used in place of an expensive Bluetooth link controller. That is, the microprocessor 600 may be inexpensively implemented by using an inexpensive 8MIPS RISC microprocessor or an 8MIPS microprocessor. Thus, it is possible to take the advantages of the above described RF system while suppressing a cost increase. Also, it is possible to conveniently control diverse performances of the applied satellite radio by virtue of the bi-directional digital communication achieved in accordance with the present invention.

Signals transmitted between the Bluetooth radio modem 500 and the microprocessor 60, as shown in FIG. 4, are defined as follows.

"Modem_Tx_DATA" is data, to be wirelessly transmitted, sent from the microprocessor 60 to the radio modem 500 in a transmission mode. "Modem_Rx/Tx_DATA" is a signal outputted from a Modem_Rx/Tx_DATA terminal. Where the Modem_Rx/Tx_DATA terminal is used as a Modem_Tx_DATA terminal, the same function as that associated with the Modem_Rx/Tx_DATA is carried out. On the other hand, where the Modem_Rx/Tx_DATA terminal is used as a Modem_Rx_DATA terminal, the radio modem 500 performs a function of outputting the data wirelessly received therein. "Modem_CD/TXEN" is used as a "TXEN" in a transmission mode to control whether or not the radio modem 500 has to perform a transmission operation, while being used as "Modem_CD" to perform a carrier detection. That is, "TXEN" represents a transmission enable state, whereas "CD" represents a carrier detection state. "Modem_RX_CLK" is a synchronous signal representing the transmission rate of data outputted from the Modem_RX_DATA terminal in a reception mode.

"HOP_STRD" is a signal for controlling transmission channel timing. "ENABLE_RM" is a signal for controlling the operation of the radio modem 500. "RESET_RM" is a signal for controlling initialization of the radio modem 500.

"BB_CLK" is a baseband clock. This baseband clock is frequency-divided into "32 MHz_CLK" which is, in turn, supplied to the microprocessor 600 as a synchronous signal. "32 KHz_CLK" is inputted to a "32 KHz_CLK" which, in turn, outputs the "32 KHz_CLK" as it is.

The SPI 507 performs a bi-directional serial communication, using four signals, to set the radio modem 500 and to check the set state of the radio modem 500. "SPI_RXD" is a terminal for receiving serial data. "SPI_SS" is a signal representing the start and end of the serial communication. "SPI_TXD" is a control signal for outputting serial data, whereas "SPI_CLK" is a synchronous signal for the serial communication.

The control logic 610 of the microprocessor 600 generates a control signal, whereas the protocol engine 609 analyzes input data, thereby determining a subsequent process. In accordance with the co-operations of the control logic 610 and protocol engine 609, the microprocessor 600 controls diverse input and output signals. The transmission buffer 603 and reception buffer 605 store output data, input data, and data produced during processing procedures, so that they contribute to efficient protocol processing.

In the radio modem 500, the system control logic 501 controls the internal elements of the radio modem 500 in accordance with the state of the register file storage unit 505 set through the SPI, thereby controlling signal transmission and reception.

Figure 5:
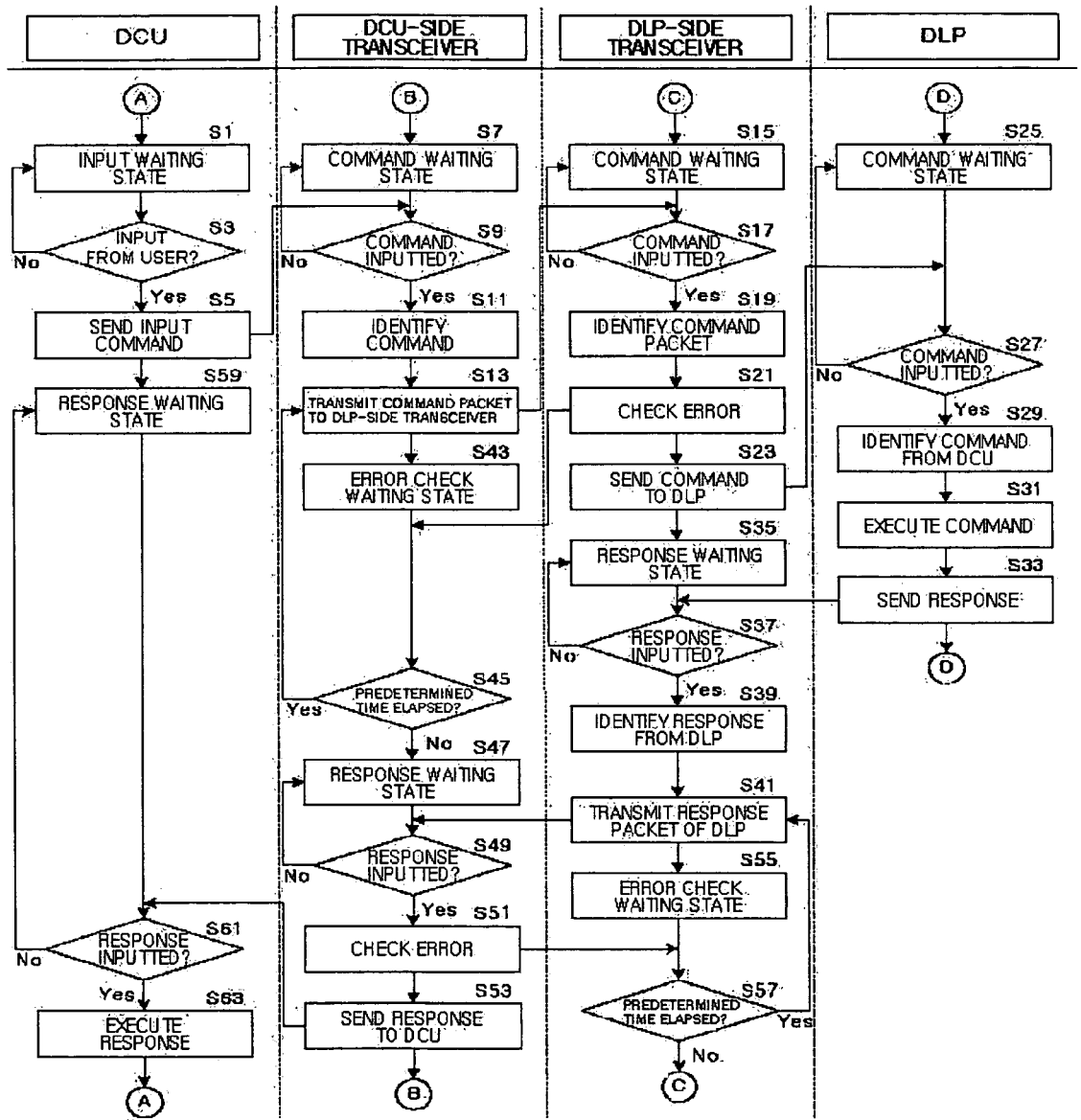
FIG. 5 is a flow chart illustrating the topology of a protocol used in accordance with the present invention.

FIG. 5 is a flow chart illustrating the topology of a protocol used in the above described system. Referring to FIG. 5, respective operations of the DCU 200, DCU-side transceiver 201, DLP-side transceiver 127, and DLP 100 are shown. The whole operation flow will be described with reference to FIG. 5. When the DCU 200 receives an input from the user, it converts the input into a command which, is in turn, sent to the DCU-side transceiver 201. In the DCU-side transceiver 201, the command is converted into a command packet. This command packet is wirelessly transmitted to the DLP-side transceiver 127 which, in turn, sends the received command packet to the DLP 100. In response to the command packet, the DLP 100 performs a desired operation, and transmits the result of the performed operation or requested data to the DCU 200 in a reverse order. These operations will be described in more detail with reference to FIG. 5.

First, the DCU 200 waits for a command inputted from the user through the key input unit 209 while power is continuously supplied to the system (S1). The DCU 200 is maintained at a command waiting state until an input signal from the user is generated. When the DCU 200 receives an input signal from the user (S3), it sends the received input signal, that is, an input command, to the DCU-side transceiver 201 (S5). Meanwhile, the DCU-side transceiver 201 is also maintained at a command waiting state until it receives a command (S7). When the DCU-side transceiver 201 determines that a command is sent from the DCU 200 thereto (S9), it identifies the sent command (S11). Subsequently, the DCU-side transceiver 201 transmits a command packet to the DLP-side transceiver 127 (S13).

When the DLP-side transceiver 127, which has also been maintained at a command waiting state (S15), determines that it has received a command from the DCU-side transceiver 201 (S17), it identifies the received command packet (S19). The DLP-side transceiver 201 performs an error checking operation (S21), and then sends the received command to the DLP 100 (S23).

When the DLP 100, which has also been maintained at a command waiting state (S25), determines, in response to the command packet, that it has received a command from the DLP-side transceiver 127 (s27), it identifies the received command (S29). The DLP 100 then executes the received command (S31). Thereafter, the DLP 100 sends a response corresponding the result of the executed operation to the DLP-side transceiver 127 (S33). When the DLP 100 completes the response, it returns to its initial state D.

Following step S23, the DLP-side transceiver 127 is maintained at a response waiting state (S35). When the DLP-side transceiver 127 determines that it has received a response from the DLP 100 (S37), it identifies the received response (S39). Subsequently, the DLP-side transceiver 127 transmits the response packet from the DLP 100 to the DCU-side transceiver 201.

Meanwhile, the DCU-side transceiver 201 is maintained at an error check waiting state, following step S13 (S43). When it is determined in the error checking procedure at step 21 that there is no error, a "no error" message is sent to the DCU-side transceiver 201. When the DCU-side transceiver 201 receives the "no error" message, it determines whether or not a predetermined time has elapsed (S45). If the predetermined time has not elapsed, the DCU-side transceiver 201 then proceeds to the next step. On the other hand, if the predetermined time has elapsed, the DCU-side transceiver 201 proceeds to step S13. At step S13, the DCU-side transceiver 201 re-transmits the command packet to the DLP-side transceiver 127. Where the predetermined time has not elapsed, the DCU-side transceiver 201 is maintained at a response waiting state (S47). When it is determined at step S41 that the DCU-side transceiver 201 has received a response packet from the DLP-side transceiver 127 (S49), the DCU-side transceiver 201 performs an error checking operation (S51). When it is determined at step S51 that there is no error, the DCU-side transceiver 201 sends a response to the DCU 200 (S53). Thereafter, the DCU-side transceiver 201 returns to its initial state B.

On the other hand, when it is determined at step S51 that there is no error, the DCU-side transceiver 201 transmits a "no error" message to the DLP-side transceiver 127. Following step S41, the DLP-side transceiver 127 is also maintained at an error check waiting state (S55). When the DLP-side transceiver 127 receives the "no error" message from the DCU-side transceiver 201, it determines whether or not a predetermined time has elapsed (S57). If the predetermined time has not elapsed, the DLP-side transceiver 127 then returns to its initial state C. On the other hand, if the predetermined time has elapsed, the DLP-side transceiver 127 proceeds to step S41. At step S41, the DLP-side transceiver 127 re-transmits the response packet to the DCU-side transceiver 201.

Meanwhile, the DCU 200 is maintained at a response waiting state, following step S5 (S59). When it is determined at step S53 that the DCU 200 has received a response from the DCU-side transceiver 201, the DCU 200 executes the response (S63). Subsequently, the DCU 200 returns to its initial state A.

The above described procedures are repeatedly carried out to generate a response corresponding to a command from the user every time the command is inputted.

As apparent from the above described procedures, the communication protocol has a topology including a carrier detecting layer, a synchronization detecting layer, a data sequence checking layer, and an error detecting layer.

In the synchronization detecting layer, the transmission side transmits data "1010 . . . " to the reception side which, in turn, checks only whether or not a synchronization has been established, based on the data. In an asynchronous state, the reception side waits for re-transmission of data from the transmission side. On the other hand, in a synchronous state, the reception side transmits a response to the transmission side. In the case of a general Bluetooth protocol, it detects an offset between transmission and reception-side data clocks, based on data of "1010", and performs tracking. For this tracking, it is necessary to use a specifically designed hardware device or high-speed processor. In remote controllers for satellite radios, the quantity of data to be transmitted is not large. Accordingly, the synchronization detecting layer may be implemented in association with such a remote controller, using an inexpensive processor, because it is unnecessary to perform a synchronization tracking operation. After a normal execution of the synchronization checking operation, a packet is transmitted. Where data of N bytes is to be transmitted, a packet of "(N+1)·2" bytes is transmitted. For example, where data of 1 byte is to be transmitted, 2 bytes are transmitted which consist of 1 byte corresponding to the data, and 1 byte to be used for error and data sequence checking. Separate 2 bytes representing the number of the packet are also transmitted while being carried on the header of the packet.

Upon receiving the data, the reception side checks the number of the received packet, data error, and data sequence. When an error is detected, the reception side requests re-transmission of data. Otherwise, the reception side sends control data to the DLP 100. Based on the control data, the DLP 100 performs a desired operation, and sends a response to the DLP-side transceiver 127. In accordance with the response, the DLP-side transceiver 127 is switched to a transmission mode. Meanwhile, the DCU-side transceiver 201 is switched to a reception mode, immediately after the transmission of the packet, so as to receive a re-transmission request or a normal response from the DLP 100. The DLP-side transceiver 127 transmits data in the same manner as in the DCU-side transceiver 201. The DCU-side transceiver 201 checks data in the same manner as in the DLP-side transceiver 127, and then requests re-transmission of data or transmits response data to the DCU 200. After receiving the response data, the DCU 200 checks whether or not the received response data is normal. If there is an error in the response data, the DCU 200 re-transmits the packet.

Figure 6A:
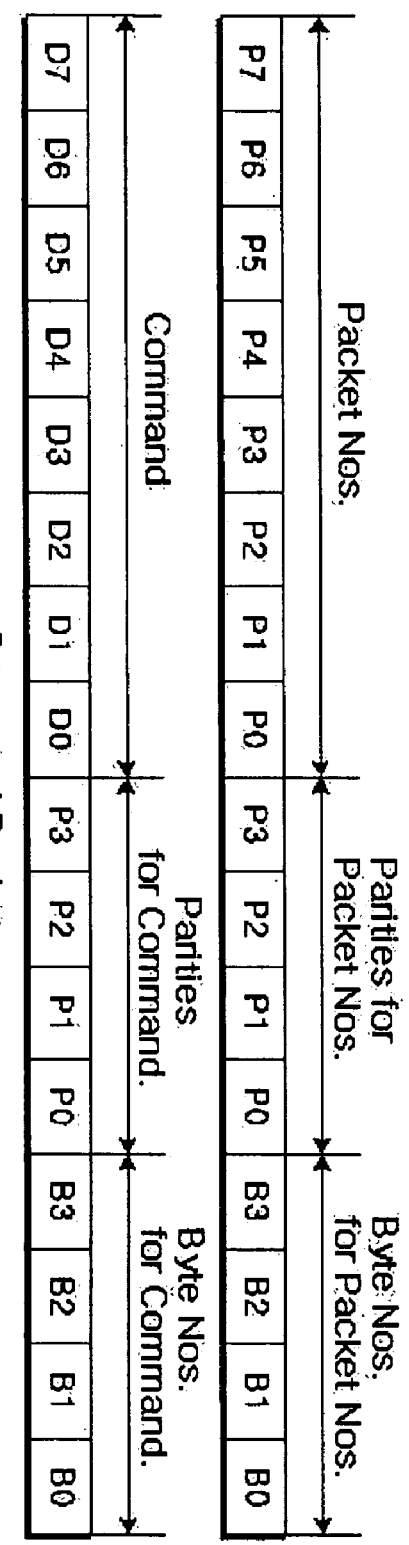
FIGS. 6a and 6b are schematic diagrams illustrating formats of packets, respectively.
Figure 6B:
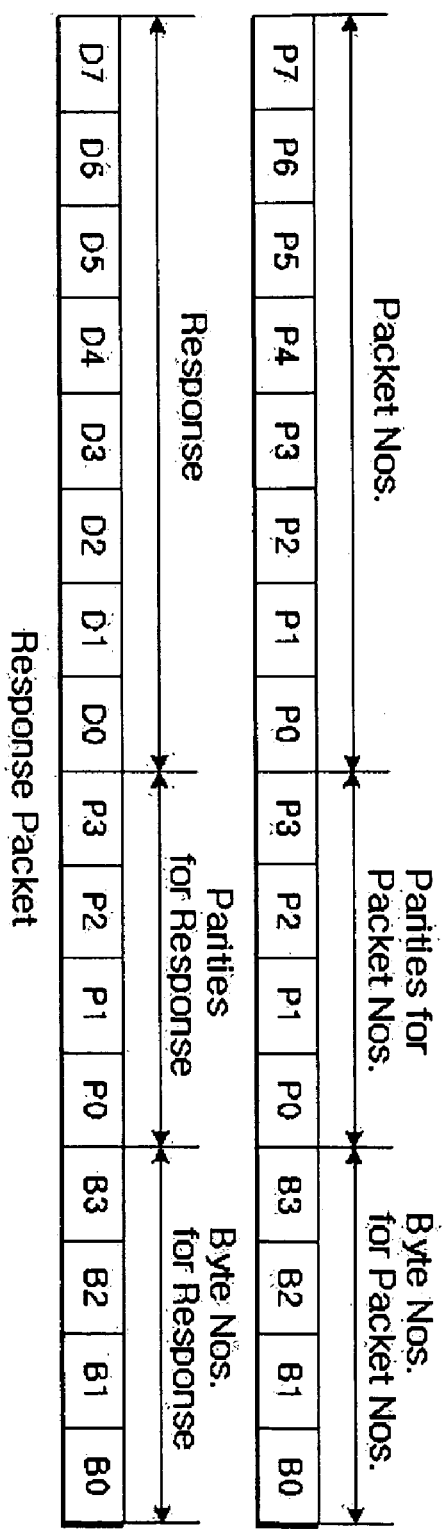

FIGS. 6*a* and 6*b* are schematic diagrams illustrating formats of packets, respectively. FIG. 6*a* shows a command packet, whereas FIG. 6*b* shows a response packet. In FIGS. 6*a* and 6*b*, "P7(MSB)" to "P0(LSB)" represent respective packet numbers, "D7" to "D0" data to be transmitted, "P3" to "P0" parities for error checking, and "B3" to "B0" sequence numbers of bytes for checking the sequence of transmitted data. The packet number is positioned on the header of the packet, and a command and response value follows the packet number.

As apparent from the above description, the wireless remote controller using a time division protocol in accordance with the present invention and the satellite radio equipped with the wireless remote controller use only a Bluetooth radio modem, as compared to a conventional system using a Bluetooth module including three parts, that is, a Bluetooth modem, a link controller, and a baseband controller. Accordingly, it is possible to inexpensively obtain the same advantages as the conventional system. The present invention also implements a commercially available inexpensive protocol, thereby optimizing the performance of a microprocessor required for TDD transmission and reception. Accordingly, it is possible to relatively inexpensively construct the system, by use of an inexpensive 8MIPS RISC microprocessor or an 8MIPS microprocessor. By virtue of use of such a Bluetooth radio modem and commercially available inexpensive protocol, it is possible to inexpensively provide, to the driver, the same convenience and advantages as the conventional system. Also, the TDD wireless remote controller according to the present invention consumes reduced power. The wireless remote controller of the present invention allows the driver to manipulate the satellite radio for listening to music of high quality and displaying diverse information while minimizing reduction of his attention to driving the motor vehicle to maintain safe driving of the motor vehicle.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A wireless remote controller using a time division protocol to remotely control a satellite radio adapted to perform an audio processing operation for time division multiplexing (TDM) and orthogonal frequency division multiplexing (OFDM) signals respectively transmitted from satellites and a terrestrial repeater by demodulating and digitally processing the TDM and OFDM signals, the remote controller comprising:

a transceiver for performing a bi-directional communication through a single channel in such a manner that transmission and reception sides are sync with each other in accordance with a time division duplexing scheme, the transceiver wirelessly transmitting a command from a user, and executing a response received thereto, wherein the transceiver comprises:

a microprocessor including a control logic for generating a control signal, a transmission buffer for temporarily storing output data, a reception buffer for temporarily storing input data while storing data produced during processing operations, thereby supporting a protocol processing operation, a serial programming interface (SPI) logic linked to an SPI, and a protocol engine for controlling input and output signals thereof associated with the control logic, in cooperation with the control logic, and analyzing input data, thereby determining a subsequent processing operation; and a Bluetooth radio modem including a system control logic for controlling transmission and reception of signals in accordance with the cooperation of the control logic and protocol engine, a clock generation/distribution unit for sending a clock, received thereto, to the control logic, or generating another clock, and distributing the generated clock, a register file storage unit for storing data set through the SPI, and the SPI for performing a bi-directional serial communication with the register file storage unit to perform a set state checking operation.

2. A satellite radio equipped with a wireless remote controller using a time division protocol, the satellite radio comprising:

a display control unit for supporting operations of a user while performing a display operation corresponding to a command from the user;

a display control unit-side transceiver for performing a bi-directional communication through a single channel in such a manner that transmission and reception sides are sync with each other in accordance with a time division duplexing scheme, the transceiver wirelessly transmitting a command from the display control unit, and executing a response received from a downlink processor:
- a downlink processor-side transceiver for performing a bi-directional communication through a single channel in such a manner that transmission and reception sides are sync with each other in accordance with a time division duplexing scheme, the transceiver transmitting the command received from the display control unit-side transceiver, and transmitting a response of the downlink processor to the command from the display control unit; and
- the downlink processor for executing the command transmitted from the display control unit, and generating a response corresponding to the command execution, the downlink processor performing an audio processing operation for time division multiplexing (TDM) and orthogonal frequency division multiplexing (OFDM) signals respectively transmitted from satellites and a terrestrial repeater by demodulating and digitally processing the TDM and OFDM signals.

3. The satellite radio according to claim 2, wherein each of the display control unit-side transceiver and downlink processor-side transceiver comprises:
- a microprocessor including a control logic for generating a control signal, a transmission buffer for temporarily storing output data, a reception buffer for temporarily storing input data while storing data produced during processing operations, thereby supporting a protocol processing operation, a serial programming interface (SPI) logic linked to an SPI, and a protocol engine for controlling input and output signals thereof associated with the control logic, in cooperation with the control logic, and analyzing input data, thereby determining a subsequent processing operation; and
- a Bluetooth radio modem including a system control logic for controlling transmission and reception of signals in accordance with the cooperation of the control logic and protocol engine, a clock generation/distribution unit for sending a clock, received thereto, to the control logic, or generating another clock, and distributing the generated clock, a register file storage unit for storing data set through the SPI, and the SPI for performing a bi-directional serial communication with the register file storage unit to perform a set state checking operation.

4. The satellite radio according to claim 3, wherein the microprocessor is an SMIPS RISC microprocessor or an 8MIPS microprocessor.

5. A satellite radio equipped with a wireless remote controller using a time division protocol, the satellite radio comprising:
- a display control unit including a key input unit for supporting operations of a user, a display unit for performing a display operation corresponding to an operation of the key input unit, and a micro controller for controlling for processing a key input signal from the key input unit, a display signal, and input and output audio signals, the micro controller including a general purpose I/O (GPIO) for outputting a GPIO signal adapted to select a signal outputted from a display control unit-side transceiver:
- a display control unit-side transceiver for performing a bi-directional communication through a single channel in such a manner that transmission and reception sides are sync with each other in accordance with a time division duplexing scheme, the transceiver wirelessly transmitting a command from the display control unit, and executing a response received from a downlink processor;
- a downlink processor-side transceiver for performing a bi-directional communication through a single channel in such a manner that transmission and reception sides are sync with each other in accordance with a time division duplexing scheme, the transceiver transmitting the command received from the display control unit-side transceiver, and transmitting a response of the downlink processor to the command from the display control unit; and
- the downlink processor including a receiver for receiving time division multiplexing (TDM) and orthogonal frequency division multiplexing (OFDM) signals, an analog/digital (A/D) converter for converting an analog signal received from the receiver into a digital signal, a demodulator for demodulating the digital signal received from the A/D converter, a TDM selector for selecting a signal having a highest SNR from TDM signals outputted from the demodulator, an OFDM selector for selecting a signal having a highest SNR from OFDM signals outputted from the demodulator, a memory for providing comparative SNR data to the TDM and OFDM selectors, a signal mixer for mixing signals outputted from the TDM and OFDM selectors, a digitallanalog (D/A) processor for processing a signal outputted from the signal mixer, thereby outputting an analog signal, and an audio D/A converter for outputting an audio signal and a stereo audio signal to the D/A processor.

* * * * *